US012785662B2

(12) United States Patent
Takeya et al.

(10) Patent No.: US 12,785,662 B2
(45) Date of Patent: Nov. 3, 2026

(54) PHASE ADJUSTMENT CIRCUIT

(71) Applicant: NTT, Inc., Tokyo (JP)

(72) Inventors: Tsutomu Takeya, Tokyo (JP); Munehiko Nagatani, Tokyo (JP); Hiroyuki Takahashi, Tokyo (JP); Hitoshi Wakita, Tokyo (JP); Teruo Jo, Tokyo (JP)

(73) Assignee: NTT, INC., Tokyo (JP)

( * ) Notice: Subject to any disclaimer, the term of this patent is extended or adjusted under 35 U.S.C. 154(b) by 0 days.

(21) Appl. No.: 18/992,819

(22) PCT Filed: Jul. 13, 2022

(86) PCT No.: PCT/JP2022/027567

§ 371 (c)(1), (2) Date: Jan. 9, 2025

(87) PCT Pub. No.: WO2024/013883

PCT Pub. Date: Jan. 18, 2024

(65) Prior Publication Data

US 2026/0019069 A1 Jan. 15, 2026

(51) Int. Cl.

*H03H 11/16* (2006.01)
*H03K 5/00* (2006.01)

(52) U.S. Cl.

CPC ... *H03H 11/16* (2013.01); *H03K 2005/00286* (2013.01)

(58) Field of Classification Search

None

See application file for complete search history.

(56) References Cited

U.S. PATENT DOCUMENTS 5,663,691 A * 9/1997 Kowalik ............. H04L 27/2071 332/123
5,692,018 A * 11/1997 Okamoto .......... H04L 25/03057 455/278.1

(Continued)

FOREIGN PATENT DOCUMENTS

JP 2013118555 A 6/2013
WO 2010021280 A1 2/2010

OTHER PUBLICATIONS

Goyal, et al., "A High-Resolution Digital Phase Interpolator based CDR with a Half-Rate Hybrid Phase Detector," 2019 IEEE International Symposium on Circuits and Systems (ISCAS), May 2019.

*Primary Examiner* — Thomas J. Hiltunen

(74) *Attorney, Agent, or Firm* — Slater Matsil, LLP

(57) ABSTRACT

An embodiment is a phase adjustment circuit includes a sine wave output circuit, a first multiplier, a second multiplier, and an adder. The sine wave output circuit is configured to output two sine wave signals of a fixed phase difference. The first multiplier is configured to multiply an amplitude of a first sine wave signal output from the sine wave output circuit by a first variable to generate a first output signal. The second multiplier is configured to multiply an amplitude of a second sine wave signal output from the sine wave output circuit by a second variable to generate a second output signal. The adder is configured to add the first output signal from the first multiplier and the second output signal from the second multiplier.

13 Claims, 14 Drawing Sheets

(56) References Cited

U.S. PATENT DOCUMENTS

| | | | | |
|---|---|---|---|---|
| 6,208,698 | B1 * | 3/2001 | Marchesani | H04L 27/364 375/295 |
| 6,229,395 | B1 * | 5/2001 | Kay | H03F 3/45183 330/252 |
| 6,657,510 | B2 * | 12/2003 | Haghighat | H04L 27/362 332/162 |
| 6,861,901 | B2 * | 3/2005 | Prexl | H03F 3/45475 329/347 |
| 7,010,278 | B2 * | 3/2006 | Kirschenmann | H04L 27/364 455/114.2 |
| 7,242,728 | B2 * | 7/2007 | Kanazawa | H04L 27/364 375/296 |
| 7,327,202 | B2 * | 2/2008 | Zhou | H04L 27/364 332/107 |
| 7,893,787 | B2 * | 2/2011 | Walkington | H03C 1/52 332/162 |
| 8,687,968 | B2 | 4/2014 | Nosaka et al. | |
| 10,718,810 | B2 * | 7/2020 | Kalgren | G01R 31/42 |
| 12,537,517 | B2 * | 1/2026 | Takeya | H03K 5/01 |
| 12,537,534 | B2 * | 1/2026 | Wang | H03L 7/0812 |

* cited by examiner

PHASE ADJUSTMENT CIRCUIT

CROSS-REFERENCE TO RELATED APPLICATIONS

This application is a national phase entry of PCT Application No. PCT/JP2022/027567, filed on Jul. 13, 2022, which application is hereby incorporated herein by reference.

TECHNICAL FIELD

The present invention relates to a phase adjustment circuit of a sine wave.

BACKGROUND

At present, the sine wave plays an important role. In communication, the sine wave may be used for generating a carrier wave, or the sine wave may be used as a clock. In the communication, the clock is used not only as the carrier wave, but also as a timing reference for determining data.

When the clock is used as the timing reference for such data determination, it is necessary to adjust the phase of the clock and perform data determination at an appropriate timing. As a method for performing the data determination at an appropriate timing, there is clock data recovery. As means for realizing clock data recovery, a configuration using a phase comparator and a phase adjustment circuit is known. In this configuration, phases are compared by some means, and a desired phase is generated on the basis of the comparison result.

In the related art, as the phase adjustment circuit, a configuration disclosed in NPL 1 is known. A configuration of the phase adjustment circuit of the related art is shown in FIG. 14. In the configuration shown in FIG. 14, by adding a sine wave sin ωt as a reference and a sine wave cos ωt having a fixed phase difference of π/2 with respect to the sine wave sin ωt by an adder 203, an arbitrary intermediate phase waveform is generated. The sine waves sin ωt and cos ωt are multiplied by constants A and B by multipliers 201 and 202, respectively. The following Equation is established from equation of trigonometric function synthesis.

[Math. 1]

$$A\sin\omega t + B\cos\omega t = \sqrt{A^2 + B^2}\sin(\omega t + \alpha) \quad (1)$$

α in Equation (1) is as follows:

[Math. 2]

$$\cos\alpha = \frac{A}{\sqrt{A^2 + B^2}},\ \sin\alpha = \frac{B}{\sqrt{A^2 + B^2}} \quad (2)$$

In the configuration of FIG. 14, sine waves sin ωt and cos ωt are generated, using a Quadrature-Voltage Controlled Oscillator (VCO) 200. However, since the Quadrature-VCO 200 has a lower oscillation frequency in terms of structure, there is a problem that it is difficult to use in a limit region of a device. In addition, although a method of using a 90 degree hybrid is known as a method of producing a sine wave having a fixed phase difference of π/2 from the sine wave, there is a problem that it operates only at a specific frequency when using the 90 degree hybrid.

CITATION LIST

Non Patent Literature

[NPL 1] Arun Goyal, et al., "A High-Resolution Digital Phase Interpolator Based CDR with a Half-Rate Hybrid Phase Detector", 2019 IEEE International Symposium on Circuits and Systems (ISCAS), May 2019

SUMMARY

Technical Problem

Embodiments of the present invention is made to solve above problem, and an object thereof is to provide a phase adjustment circuit that can be used in a wide range of frequencies.

Solution to Problem

A phase adjustment circuit according to embodiments of the present invention include a sine wave output unit configured to output two sine wave signals of a fixed phase difference; a first multiplying unit configured to output a signal obtained by multiplying an amplitude of a first sine wave signal output from the sine wave output unit by a first variable; a second multiplying unit configured to output a signal obtained by multiplying an amplitude of a second sine wave signal output from the sine wave output unit by a second variable; an adding unit configured to add the signal output from the first multiplying unit and the signal output from the second multiplying unit; an amplitude detecting unit configured to detect an amplitude of an output signal of the adding unit; a differential amplifying unit configured to subtract and amplify the amplitude detected by the amplitude detecting unit from a target amplitude; a first low-pass filter configured to flatten an output result of the differential amplifying unit; a third multiplying unit configured to apply a signal obtained by multiplying an amplitude of the signal output from the first low-pass filter by a first constant, to the first multiplying unit as a control signal for determining the first variable; and a fourth multiplying unit configured to apply a signal obtained by multiplying the amplitude of the signal output from the first low-pass filter by a second constant, to the second multiplying unit as a control signal for determining the second variable.

Advantageous Effects

According to embodiments of the present invention, by providing a sine wave output unit, first and second multiplying units, and an adding unit, it is not necessary to use a conventional Quadrature-VCO as a clock generation unit which is a base of the since wave signal, and an LC-VCO made up of a general LC oscillator can be used as the clock generation unit. In addition, embodiments of the present invention can be used in a wide range of frequencies, unlike a configuration in which a 90-degree hybrid is used as the clock generation unit. Further, in embodiments of the present invention, by providing an amplitude detecting unit, a differential amplifying unit, a first low-pass filter, and third and fourth multiplying units, an output amplitude of the adding unit can be made constant.

DETAILED DESCRIPTION OF ILLUSTRATIVE EMBODIMENTS

Principles of Embodiments of the Invention

First, a configuration of a phase adjustment circuit according to embodiments of the present invention will be explained using FIG. 1. Embodiments of the present invention realize a function of adjusting the phase to an arbitrary phase by adding two sine waves having an arbitrary phase difference at an arbitrary ratio.

Figure 1:
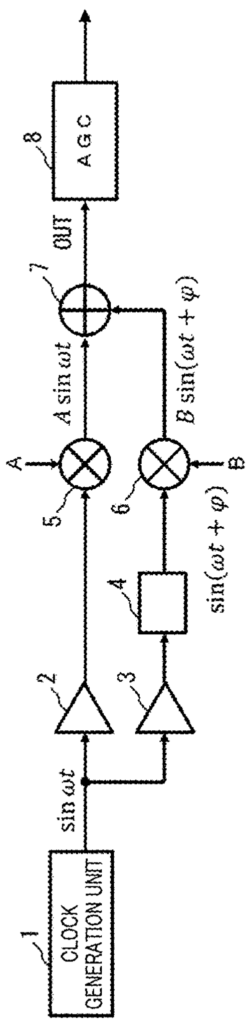
FIG. 1 is a block diagram showing a configuration of a phase adjustment circuit according to embodiments of the present invention.

The phase adjustment circuit of FIG. 1 includes a clock generation unit 1 which generates a sinusoidal clock signal, buffer units 2 and 3 which receive a signal output from the clock generation unit 1 as an input, a delay unit 4 which delays the signal output from the buffer unit 3, a multiplying unit 5 which outputs a signal obtained by multiplying an amplitude of the signal output from the buffer unit 2 by A, a multiplying unit 6 which outputs a signal obtained by multiplying an amplitude of the signal output from the delay unit 4 by B, an adding unit 7 which adds the signal output from the multiplying unit 5 and the signal output from the multiplying unit 6, and an automatic gain control (AGC) unit 8 which keeps the amplitude of the output signal of the adding unit 7 constant.

In the configuration shown in FIG. 1, it is possible to generate an arbitrary waveform by adding a reference sine wave sin ωt and a sine wave sin (ωt+φ), which differs in phase by φ, at an arbitrary magnification. The clock generation unit 1 does not need to use a conventional Quadrature-VCO, and can use an LC-VCO made up of a general LC oscillator. In addition, the configuration shown in FIG. 1 can be used at a wide range of frequencies, unlike a configuration that uses a 90-degree hybrid like the clock generation unit 1. An output signal OUT of the adding unit 7 is expressed by the following Equation.

[Math. 3]

$$\mathrm{OUT} = A\sin\omega t + B\sin(\omega t+\varphi) = \mathrm{Im}\left[Ae^{j\omega t} + Be^{j(\omega t+\varphi)}\right] = \mathrm{Im}\left[\left(A + Be^{j\varphi}\right)e^{j\omega t}\right] = \mathrm{Im}\left[re^{j\rho}e^{j\omega t}\right] \tag{3}$$

In Equation (3), ejωt represents a reference sin wave. It can be seen from Equation (3) that the sin wave having the phase different by p from the reference phase can be generated, by adding the sin wave having the reference frequency and the sin wave having a phase different by an arbitrary phase φ. Here, the phase angle ρ is given by Equation (4).

[Math. 4]

$$\rho = \arg\left(B\left[\frac{A}{B} + \cos(\varphi) + j\sin(\varphi)\right]\right) = \arg\left(\frac{A}{B} + \cos(\varphi) + j\sin(\varphi)\right) \tag{4}$$

In the configuration shown in FIG. 1, there is a problem that it is difficult to keep the amplitude of the output signal OUT of the adding unit 7 constant. Therefore, an AGC unit 8 is added as a solution. The AGC unit 8 detects the amplitude of the output signal OUT of the adding unit 7 and adjusts the output amplitude by automatically controlling the amplification factor. However, when the AGC unit 8 is inserted into a main signal path, there is a problem that distortion caused by nonlinearity of the AGC unit 8 is generated in the signal. Further, there is a problem that noise increases and signal quality deteriorates.

In embodiments of the present invention, output amplitude adjustment without using AGC is realized on the basis of the configuration shown in FIG. 1.

First Embodiment

Figure 2:
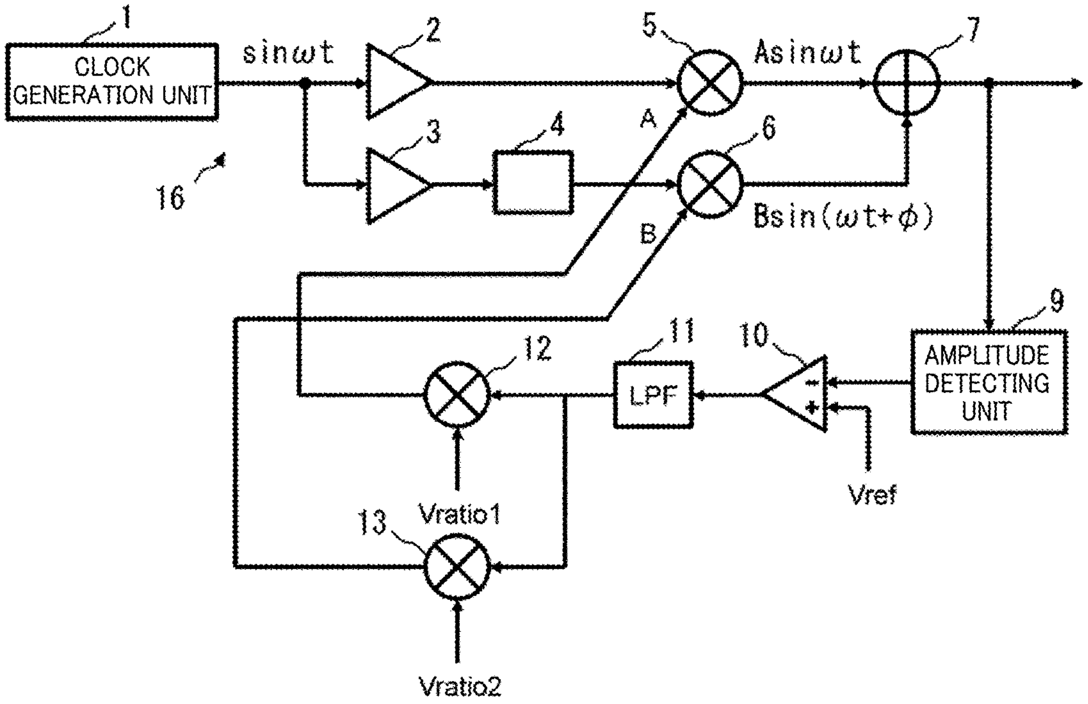
FIG. 2 is a block diagram showing a configuration of a phase adjustment circuit according to a first embodiment of the present invention.

Embodiments of the present invention will be described hereinafter with reference to the drawings. FIG. 2 is a block diagram showing a configuration of a phase adjustment circuit according to a first embodiment of the present invention. The phase adjustment circuit includes a clock generation unit 1 which generates a sinusoidal clock signal, buffer units 2 and 3 which receive a signal output from the clock generation unit 1 as an input, a delay unit 4 which delays the signal output from the buffer unit 3, a multiplying unit 5 which outputs a signal obtained by multiplying an amplitude of the signal output from the buffer unit 2 by A (first variable), a multiplying unit 6 which outputs a signal obtained by multiplying an amplitude of the signal output from the delay unit 4 by B (second variable), an adding unit 7 which adds the signal output from the multiplying unit 5 and the signal output from the multiplying unit 6, an amplitude detecting unit 9 which detects the amplitude of the output signal of the adding unit 7, a differential amplifying unit 10 which subtracts the amplitude detected by the amplitude detecting unit 9 from a target amplitude Vref and amplifies it, a low-pass filter (LPF) 11 which flattens the output result from the differential amplifying unit 10, a multiplying unit 12 which applies a signal obtained by multiplying the amplitude of the signal output from the LPF 11 by Vratio1 (first constant) to the multiplying unit 5 as a control signal for determining the first variable, and a multiplying unit 13 that supplies a signal obtained by multiplying the amplitude of the signal output from the LPF 11 by Vratio2 (second constant) to the multiplying unit 6 as a control signal for determining the second variable.

The clock generation unit 1, the buffer units 2 and 3, and the delay unit 4 constitute a sine wave output unit 16 that outputs two sine wave signals having a fixed phase difference. The phase difference between the two sine wave signals is not limited to 90 degrees, but may be an arbitrary phase difference. In embodiments of the present invention, the sine wave output unit 16 may have a configuration different from that shown in FIG. 2.

Vratio1 and Vratio2 are arbitrary real numbers set in advance. A and B are real numbers determined by the control signals output from the multiplying units 12 and 13.

It is apparent from Equations (3) and (4) that the phase difference given to the reference phase (phase of sine wave sin ωt output from the clock generation unit 1) is determined by the ratio of A to B. In this embodiment, the same phase difference as that when A=Vratio1 and B=Vratio2 are set.

The configuration of this embodiment includes a feedback circuit for controlling the signal amplitude. The feedback circuit is made up of the multiplying units 5 and 6, an adding unit 7, the amplitude detecting unit 9, a differential amplifying unit 10, the LPF 11, and the multiplying units 12 and 13. The feedback circuit is equivalent to the control model of the signal amplitude as shown in FIG. 3.

Y indicates the amplitude of the signal output from the adding unit 7, and P indicates a fixed amplitude which is the result of amplitude adjustment based on the signal output from the adding unit 7 when A=Vratio1 and B=Vratio2 are satisfied. The control model is made up of a subtracting unit 100 which subtracts the amplitude Y from the target amplitude Vref, an amplifying unit 101 which amplifies the subtraction result from the subtracting unit 100, an LPF 102 which allows only a low frequency component out of the output of the amplifying unit 101 to pass, and a multiplying unit 103 which multiplies the constant amplitude P by the output of the LPF 102.

As described above, the phase difference given to the reference phase is determined from the ratio of A to B. The ratio is determined as A:B=Vratio1:Vratio2, and set to a constant value by Vratio1 and Vratio2.

Figure 3:
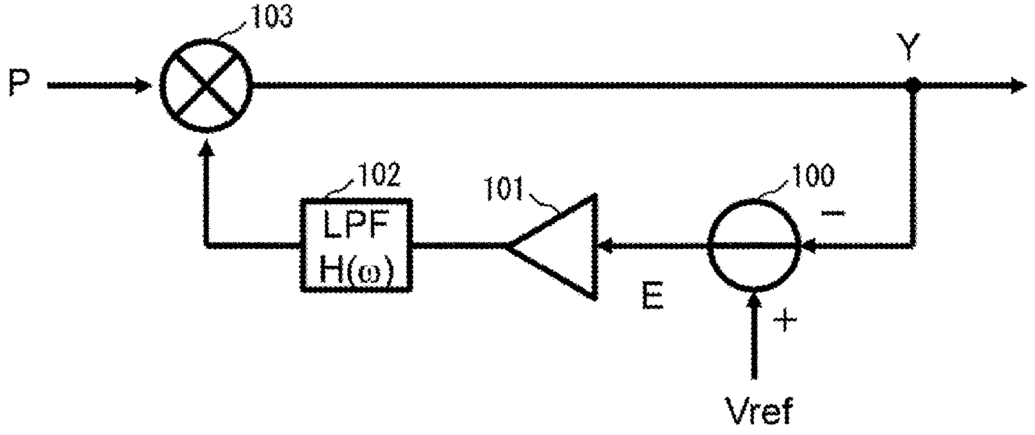
FIG. 3 is a diagram showing a control model of a signal amplitude in the first embodiment of the present invention.

The control model shown in FIG. 3 shows a general feedback system. On the assumption that the entire system is stable, by applying a low-pass characteristic as the frequency characteristic H(ω), the amplitude Y can be brought close to the target amplitude Vref.

Figure 4:
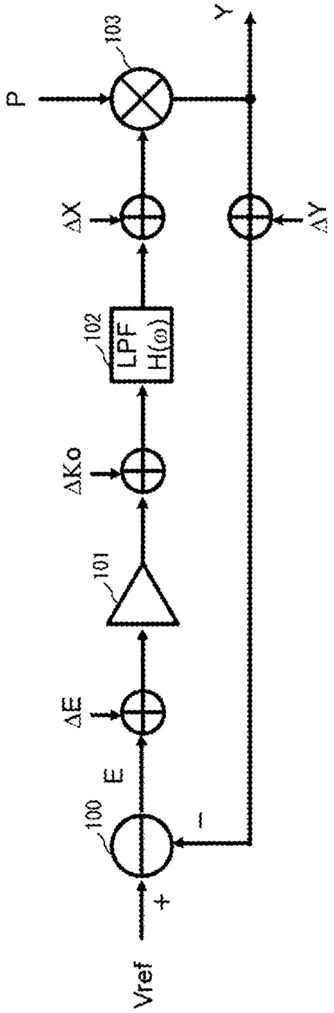
FIG. 4 is a block diagram showing a configuration when noise is input to each node of the control model of FIG. 3.

Next, the stability of the control model will be considered. In order to stabilize the control model, it is necessary that the signal at the output terminal be stable even when noise is input to each node shown in FIG. 3. FIG. 4 shows a block diagram of a control model when it is assumed that noise is input to each node. Here, the block diagram is rewritten with Vref as an input and Y as an output.

ΔE is a noise which is input to the amplifying unit 101, ΔKo is a noise which is input to the LPF 102, ΔX is a noise which is input to the multiplying unit 103, and ΔY is a noise which is input to the subtracting unit 100. When the transfer characteristic of the amplifying unit 101 is represented by K and the transfer characteristic of the structure shown in FIG. 4 is calculated, Equation (5) is obtained.

$$\{\{\{Vref-(Y+\Delta Y)+\Delta E\}\times K+\Delta Ko\}\times H+\Delta X\}xP= \tag{5}$$

$$Y\rightarrow\{\{\{Vref-(Y+\Delta Y)+\Delta E\}\times K+\Delta Ko\}\times H+\Delta X\}=$$

$$Y/P\rightarrow\{\{Vref-(Y+\Delta Y)+\Delta E\}\times K+\Delta Ko\}\times H=$$

$$Y/P-\Delta X\rightarrow\{Vref-(Y+\Delta Y)+\Delta E\}\times K+\Delta Ko=$$

$$Y/PH-\Delta X/H\rightarrow\{Vref-(Y+\Delta Y)+\Delta E\}\times K=$$

$$Y/PH-\Delta X/H-\Delta Ko\rightarrow\{Vref-(Y+\Delta Y)+\Delta E\}=Y/PHK-\Delta X/HK-$$

$$\Delta Ko/K\rightarrow\{Vref-(\Delta Y)+\Delta E\}+\Delta X/HK+\Delta Ko/K=Y(1+1/PHK)\rightarrow$$

$$Y=\left[\{Vref-(\Delta Y)+\Delta E\}+\Delta X/HK+\Delta Ko/K\right]\times PHK/(PHK+1)$$

When the influence on the output amplitude Y from each noise component is calculated, a term of PHK/(1+PHK)×(ΔE−ΔY), a term of P/(1+PHK)×(ΔX), and a term of PH/(1+PHK)×(ΔKo) overlap. Therefore, in order to stabilize the control model, it is necessary to satisfy the following three conditions (I) to (III).

(I) PHK/(1+PHK) is stable.

(II) P/(1+PHK) is stable.

(III) PH/(1+PHK) is stable.

Since the amplitude P is a constant, the condition (II) may be stated as "1/(1+PHK) is stable," the condition (III) may be stated as "H is stable" under the condition (II), and similarly, the condition (I) may be stated as "K is stable." Thus, when the conditions for stabilizing the control model are reorganized, it is necessary to satisfy the following three conditions (a) to (c). Therefore, the feedback circuit may be designed to satisfy the conditions (a) to (c).

(a) The transfer characteristic K of the amplifier is stable.

(b) The characteristic H of the LPF is stable.

(c) 1/(1+PHK) is stable.

Figure 5:
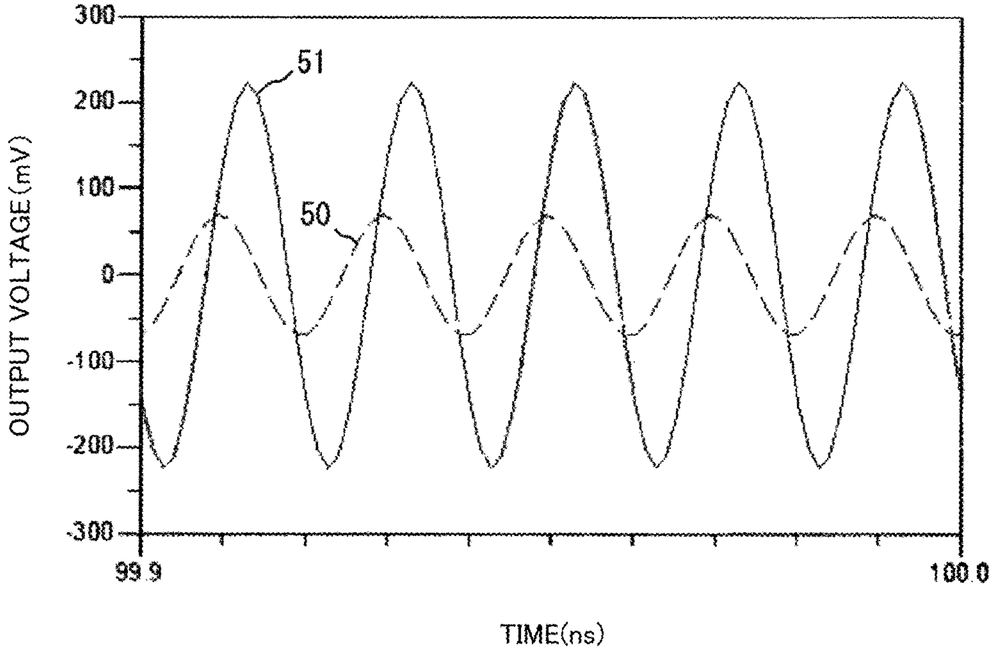
FIG. 5 is a diagram showing simulation results of the phase adjustment circuit of FIG. 1.
Figure 6:
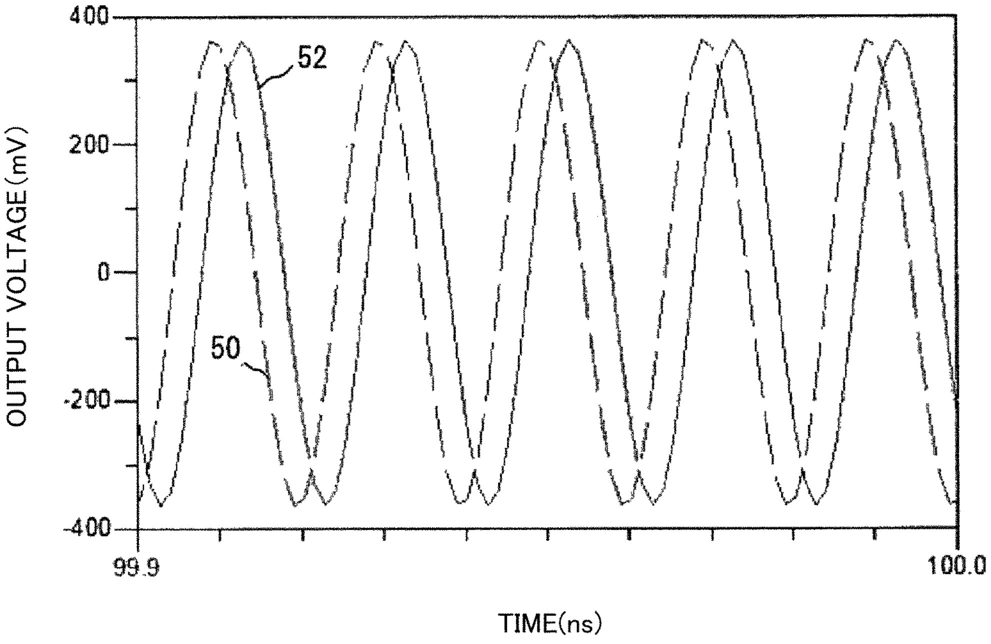
FIG. 6 is a diagram showing simulation results of the phase adjustment circuit according to the first embodiment of the present invention.

FIG. 5 shows the results of confirming by a circuit simulation that the phase of the sine wave changes by the phase adjustment circuit shown in FIG. 1, and FIG. 6 shows the results of confirming by the circuit simulation that the phase of the sine wave changes by the phase adjustment circuit of this embodiment. Reference numeral 50 denotes a sine wave output from the clock generation unit 1, 51 denotes a sine wave (output of the adding unit 7) whose phase is changed by the phase adjustment circuit shown in FIG. 1, and 52 denotes a sine wave whose phase is changed by the phase adjustment circuit of this embodiment.

In the case of the phase adjustment circuit shown in FIG. 1, the output amplitude fluctuates greatly with respect to the input without adding the AGC unit, but it is understood that the output amplitude can be made constant in this embodiment.

Although there are many methods for realizing the delay unit 4, the delay unit 4 may be realized by, for example, propagation delay of wiring. In particular, a transmission line may be used as a wiring for realizing the delay unit 4 to cope with a high frequency. The type and structure of the transmission line are not limited. A coplanar line or a microstrip line may be used as the transmission line.

Further, as the delay unit 4, an arbitrary number of amplifiers may be cascade-connected. Further, the delay unit 4 may be realized by a lumped constant element. For example, the delay unit 4 can be realized by an LCR resonance circuit.

Further, the delay unit 4 may be realized by combining the wiring, the amplifier, and the lumped constant element.

Second Embodiment

Figure 7:
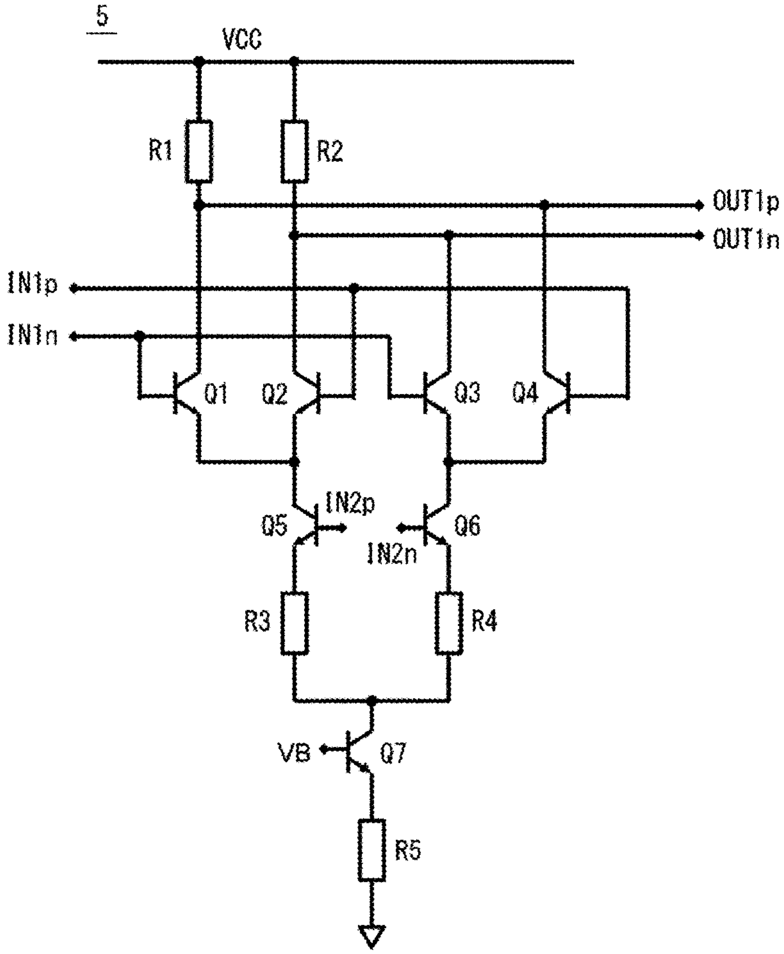
FIG. 7 is a circuit diagram showing a configuration of a multiplying unit according to a second embodiment of the present invention.

In this embodiment, specific embodiments of the multiplying units 5, 6, 12 and 13 of the first embodiment will be described. Gilbert cells, which are variable amplifiers, can be used as the multiplying units 5, 6, 12, and 13. As shown in FIG. 7, the multiplying unit 5 includes an NPN bipolar transistor Q1 in which a control signal IN1*n* (first control signal or third control signal) is input to a base and an output signal OUT1*p* on a positive phase side is output from a collector; an NPN bipolar transistor Q2 in which a control signal IN1*p* (second control signal or fourth control signal) is input to a base and an output signal OUT1*n* of a negative phase side is output from a collector; an NPN bipolar transistor Q3 in which a control signal IN1*n* is input to a base and an output signal OUT1*n* of the negative phase side is output from a collector; an NPN bipolar transistor Q4 in which a control signal IN1*p* is input to a base and an output signal OUT1*p* of the positive phase side is output from a collector; an NPN bipolar transistor Q5 in which a signal IN2*p* of the positive phase side of the differential signal output from the buffer unit 2 is input to a base and a collector is connected to emitters of the transistors Q1 and Q2; an NPN bipolar transistor Q6 in which a signal IN2*n* of the negative phase side of the differential signal output from the buffer unit 2 is input to a base and a collector is connected to emitters of the transistors Q3 and Q4; an NPN bipolar transistor Q7 in which a bias voltage VB is applied to a base, a resistor R1 which has one end connected to a power supply voltage VCC and the other end connected to the collectors of the transistors Q1 and Q4; a resistor R2 which has one end connected to the power supply voltage VCC and the other end connected to the collectors of the transistors Q2 and Q3; a resistor R3 which has one end connected to the emitter of the transistor Q5 and the other end connected to the collector of the transistor Q7; a resistor R4 which has one end connected to the emitter of the transistor Q6 and the other end connected to the collector of the transistor Q7; and a resistor R5 which has one end connected to the emitter of the transistor Q7 and the other end connected to the ground.

An amplification factor (the amplitude A) of the multiplying unit 5 can be controlled by a voltage difference between the control signals IN1*p* and IN1*n*.

The configuration of the multiplying unit 6 is the same as that of the multiplying unit 5. In the case of the multiplying unit 6, differential signals IN2*p* and IN2*n* output from the delay unit 4 are input to transistors Q5 and Q6. The amplification factor (the amplitude B) of the multiplying unit 6 can be controlled by the voltage difference between the control signals IN1*p* and IN1*n*.

The configuration of the multiplying unit 12 is the same as that of the multiplying unit 5. In the case of the multiplying unit 12, differential signals IN2*p* and IN2*n* output from the LPF 11 are input to transistors Q5 and Q6. An amplification factor (the constant Vratio1) of the multiplying unit 12 can be set to a constant value by a voltage difference between the control signals IN1*p* and IN1*n*.

The configuration of the multiplying unit 13 is the same as that of the multiplying unit 5. In the case of the multiplying unit 13, differential signals IN2*p* and IN2*n* output from the LPF 11 are input to the transistors Q5 and Q6. The amplification factor of the multiplying unit 13 (the above constant Vratio2) can be set to a constant value by the voltage difference between the control signals IN1*p* and IN1*n*.

In the Gilbert cell, (IN1*p*−IN1*n*)×(IN2*p*−IN2*n*) obtained by multiplying (IN1*p*−IN1*n*) and (IN2*p*−IN2*n*) becomes an output (OUT1*p*-OUT1*n*) in terms of the structure. Therefore, the differential signals output from the buffer unit 2, delay unit 4, and LPF 11 may be assigned to IN1*p* and IN1*n*, and IN2*p* and IN2*n* may be used as control signals.

Figure 8:
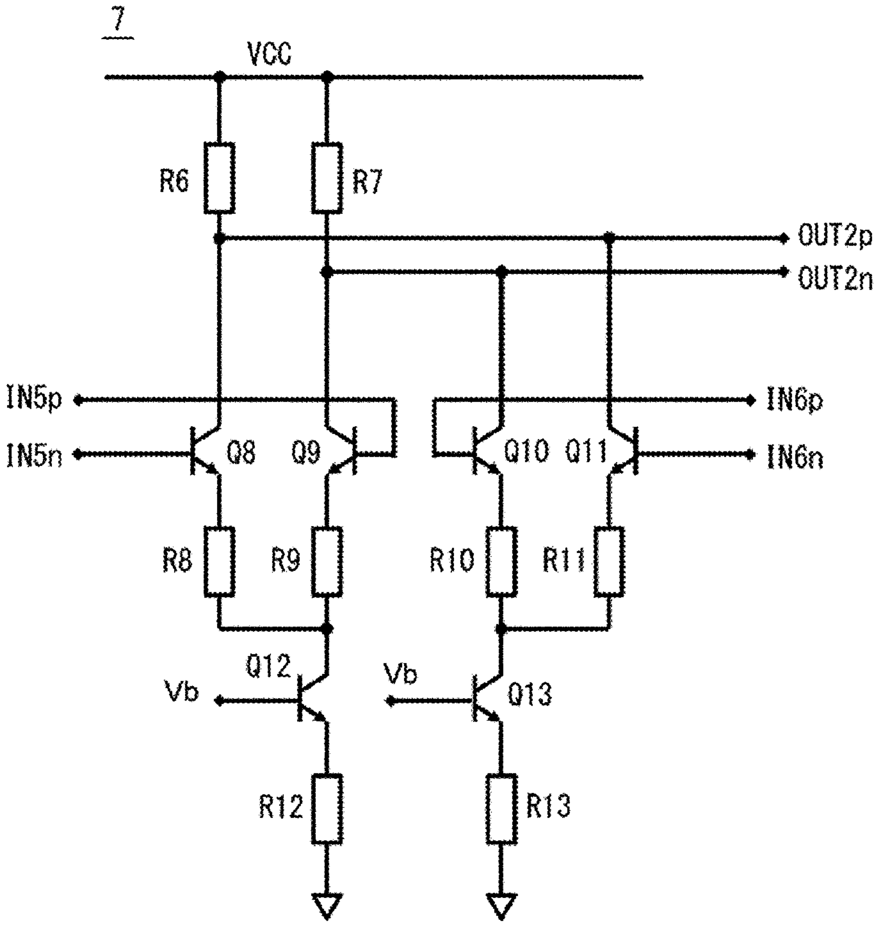
FIG. 8 is a circuit diagram showing a configuration of an adding unit according to a third embodiment of the present invention.

In the configuration shown in FIG. 7, multiplying units 5, 6, 12, and 13 have a differential input and differential output type configuration. In order to correspond to the configurations of FIG. 7, the buffer units 2 and 3 may be a differential output type buffer unit. Further, the delay unit 4 may be a differential transmission line including two transmission lines, or may have a configuration in which differential input and differential output type amplifiers Third Embodiment In this embodiment, a specific embodiment of the adding unit 7 of the first embodiment will be explained. As the adding unit 7, a current mode logic (CML) block of a current addition base can be used. As shown in FIG. 8, the adding unit 7 includes an NPN bipolar transistor Q8 in which a signal IN5*n* on a negative phase side of the differential signal output from the multiplying unit 5 is input to a base and an output signal OUT2*p* of a positive phase side is output from a collector; an NPN bipolar transistor Q9 in which a signal IN5*p* of the positive phase side of the differential signal output from the multiplying unit 5 is input to a base and an output signal OUT2*n* of the negative phase side is output from a collector; an NPN bipolar transistor Q10 in which a signal IN6*p* of the positive phase side of the differential signal output from the multiplying unit 6 is input to a base and an output signal OUT2*n* of the negative phase side is output from a collector; an NPN bipolar transistor Q11 in which a signal IN6*n* of the negative phase side of the differential signal output from the multiplying unit 6 is input to a base, and an output signal OUT2*p* of the positive phase side is output from a collector; NPN bipolar transistors Q12 and Q13 in which a bias voltage Vb is applied to a base; a resistor R6 which has one end connected to a power supply voltage VCC and the other end connected to the collectors of the transistors Q8 and Q11; a resistor R7 which has one end connected to the power supply voltage VCC and the other end connected to the collectors of the transistors Q9 and Q10; a resistor R8 which has one end connected to an emitter of the transistor Q8 and the other end connected to the collector of the transistor Q12; a resistor R9 which has one end connected to an emitter of the transistor Q9 and the other end connected to the collector of the transistor Q12; a resistor R10 which has one end connected to an emitter of the transistor Q10 and the other end connected to the collector of the transistor Q13; a resistor R11 which has one end connected to an emitter of the transistor Q11 and the other end connected to the collector of the transistor Q13; a resistor R12 which has one end connected to an emitter of the transistor Q12 and the other end connected to the ground; and a resistor R13 which has one end connected to an emitter of the transistor Q13 and the other end connected to the ground.

In the configuration of FIG. 8, the adding unit 7 has a differential input and differential output type configuration. In order to correspond to the configuration shown in FIG. 8, the multiplying units 5 and 6 may be of differential output type as shown in FIG. 7.

The configuration of FIG. 8 may be used as the differential amplifying unit 10. In the case of applying to the differential amplifying unit 10, a signal on the positive phase side of the differential signal indicating the target amplitude Vref may be input as IN6*p* of FIG. 8, and a signal on the negative phase side of the differential signal indicating the target amplitude Vref may be input as IN6*n*. The signal on the negative phase side of the differential signal output from the amplitude detecting unit 9 may be input as IN5*p* of FIG. 8, and the signal on the positive phase side of the differential signal output from the amplitude detecting unit 9 may be input as IN5*n*. It is possible to provide a gain depending on how to obtain a circuit constant. In order to achieve both high speed and gain, an amplifying circuit may be provided at a subsequent stage of the configuration of FIG. 8 to form a multi-stage configuration.

Fourth Embodiment

Figure 9:
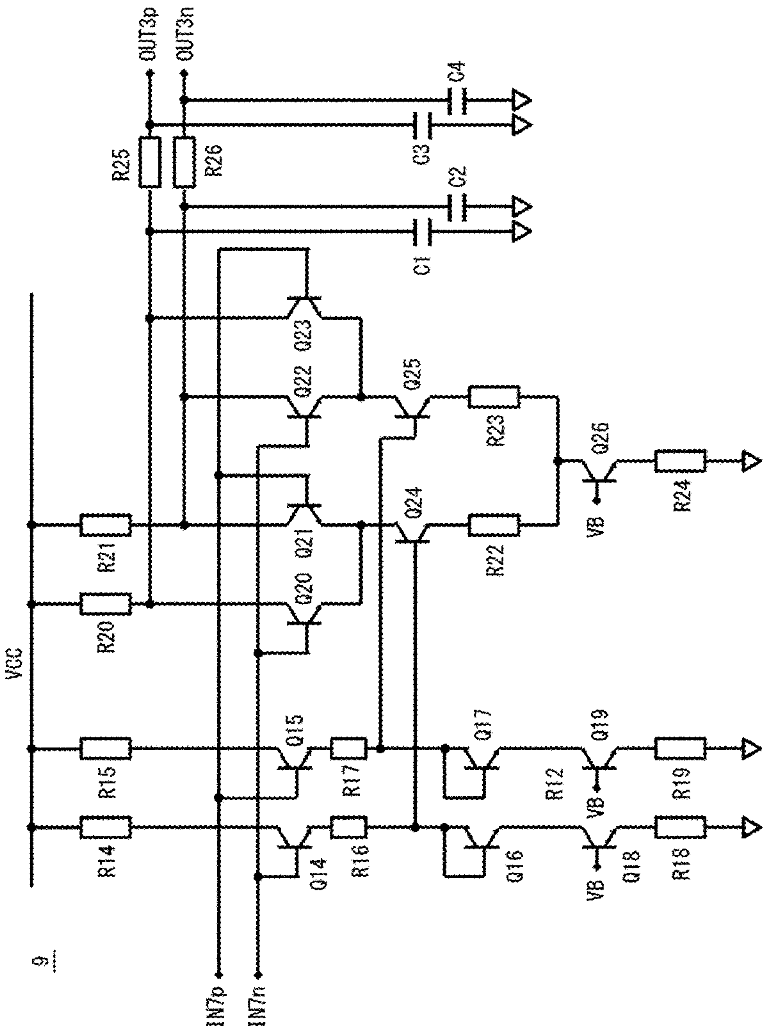
FIG. 9 is a circuit diagram showing a configuration of an amplitude detecting unit according to a fourth embodiment of the present invention.

In this embodiment, a specific embodiment of the amplitude detecting unit 9 of the first embodiment will be described. A circuit based on a Gilbert cell can be used as the amplitude detecting unit 9. As shown in FIG. 9, the amplitude detecting unit 9 includes an NPN bipolar transistor Q14 in which a signal IN7*n* on the negative phase side of the differential signal output from the adding unit 7 is input to a base; an NPN bipolar transistor Q15 in which a signal IN7*p* on the positive phase side of the differential signal output from the adding unit 7 is input to a base; an NPN bipolar transistor Q16 to which a base and a collector are connected; an NPN bipolar transistor Q17 to which a base and a collector are connected; an NPN bipolar transistor Q18 in which a bias voltage VB is applied to a base and a collector is connected to an emitter of the transistor Q16; an NPN bipolar transistor Q19 in which the bias voltage VB is applied to a base and a collector is connected to an emitter of the transistor Q17; an NPN bipolar transistor Q20 in which a signal IN7*n* on the negative phase side of the differential signal output from the adding unit 7 is input to a base; an NPN bipolar transistor Q21 in which a signal IN7*p* on the positive phase side of the differential signal output from the adding unit 7 is input to a base; an NPN bipolar transistor Q22 in which the signal IN7*n* on the negative phase side of the differential signal output from the adding unit 7 is input to a base; an NPN bipolar transistor Q23 in which a signal IN7*p* on the positive phase side of the differential signal output from the adding unit 7 is input to a base; an NPN bipolar transistor Q24 in which a base is connected to the base and the collector of the transistor Q16 and a collector is connected to emitters of transistors Q20 and Q21; an NPN bipolar transistor Q25 in which a base is connected to the base and the collector of the transistor Q17 and a collector is connected to emitters of the transistors Q22 and Q23; an NPN bipolar transistor Q26 in which a bias voltage VB is applied to a base; a resistor R14 whose one end is connected to the power supply voltage VCC and the other end is connected to a collector of the transistor Q14; a resistor R15 whose one end is connected to the power supply voltage VCC and the other end is connected to a collector of the transistor Q15; a resistor R16 whose one end is connected to an emitter of the transistor Q14 and the other end is connected to the base and collector of the transistor Q16; a resistor R17 whose one end is connected to an emitter of the transistor Q15 and the other end is connected to the base and collector of the transistor Q17; a resistor R18 whose one end is connected to an emitter of the transistor Q18 and the other end is connected to the ground; a resistor R19 whose one end is connected to an emitter of the transistor Q19 and the other end is connected to the ground; a resistor R20 whose one end is connected to the power supply voltage VCC and the other end is connected to collectors of transistors Q20 and Q23; a resistor R21 whose one end is connected to the power supply voltage VCC and the other end is connected to collectors of the transistors Q21 and Q22; a resistor R22 whose one end is connected to an emitter of transistor Q24 and the other end is connected to a collector of transistor Q26; a resistor R23 whose one end is connected to an emitter of the transistor Q25 and the other end is connected to a collector of the transistor Q26; a resistor R24 whose one end is connected to an emitter of the transistor Q26 and the other end is connected to ground; a resistor R25 in which one end is connected to collectors of transistors Q20 and Q23 and an output signal OUT3*p* of the positive phase side is output from the other end; a resistor R26 in which one end is connected to collectors of the transistors Q21 and Q22, and an output signal OUT3*n* on the negative phase side is output from the other end; a capacitor C1 whose one end is connected to collectors of the transistors Q20 and Q23 and the other end is connected to the ground; a capacitor C2 whose one end is connected to collectors of the transistors Q21 and Q22 and the other end is connected to the ground; a capacitor C3 whose one end is connected to the other end of the resistor R25 and the other end is connected to the ground; and a capacitor C4 whose one end is connected to the other end of the resistor R26 and the other end is connected to the ground.

In the circuit of FIG. 9, the output amplitude of the adding unit 7 is squared by a squarer made up of transistors Q14 to Q26 and resistors R14 to R24, and the squared amplitude is flattened by an LPF made up of resistors R25 and R26 and capacitors C1 to C4 to detect the amplitude. In order to realize the square of the amplitude by the Gilbert cell, it is necessary to absorb the difference of the in-phase signal level between the signals input to the transistors Q20 to Q23 and the signals input to the transistors Q24 and Q25, and an emitter follower made up of transistors Q14 to Q19 and resistors R14 to R19 is inserted in the first stage to adjust the In-phase level of the input signal. It is also possible to replace the diode-connected transistors Q16 and Q17 with resistors or diodes.

In the configurations of FIG. 9, the amplitude detecting unit 9 has a differential input and differential output type configuration. In order to correspond to the configuration of FIG. 9, the adding unit 7 may be of a differential output type as shown in FIG. 8.

Fifth Embodiment

Figure 10:
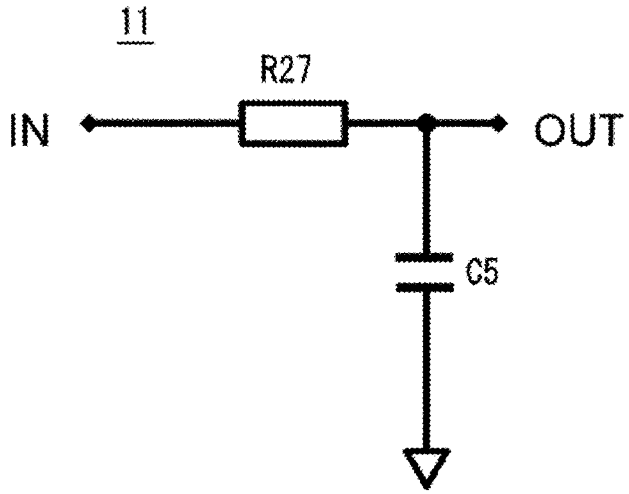
FIG. 10 is a circuit diagram showing the configuration of a low-pass filter according to a fifth embodiment of the present invention.

In this embodiment, a specific embodiment of the LPF 11 of the first embodiment will be explained. As shown in FIG. 10, the LPF 11 includes a resistor R27 in which a signal output from the differential amplifying unit 10 is input to one end, and the other end is connected to an output terminal of the LPF 11; and a capacitor C5 whose one end is connected to an output terminal of LPF 11 and the other end is connected to the ground. An inductor may be used instead of the resistor R27, or the resistor and the inductor may be used in combination.

Although FIG. 10 shows the configuration of a passive LPF, an active filter may be used. A digital filter may be used instead of the analogue filter. That is, the signal may be analogue-to-digital (AD) converted, the signal may be digitally processed, and the digital signal may be returned to the analogue signal by digital-to-analog (DA) conversion.

Sixth Embodiment

Figure 11:
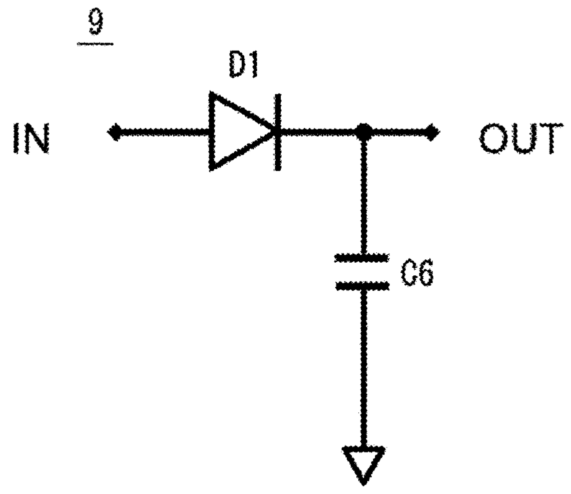
FIG. 11 is a circuit diagram showing a configuration of an amplitude detecting unit according to a sixth embodiment of the present invention.

The amplitude detecting unit 9 may be constituted by the squarer and the LPF as described in the fourth embodiment, but may be constituted by a peak detector as shown in FIG. 11. In the embodiment shown in FIG. 11, the amplitude detecting unit 9 includes a diode D1 in which a signal output from the adding unit 7 is input to an anode and a cathode is connected to an output terminal of the amplitude detecting unit 9, and a capacitor C6 whose one end is connected to the output terminal of the amplitude detecting unit 9 and the other end is connected to the ground.

Figure 12:
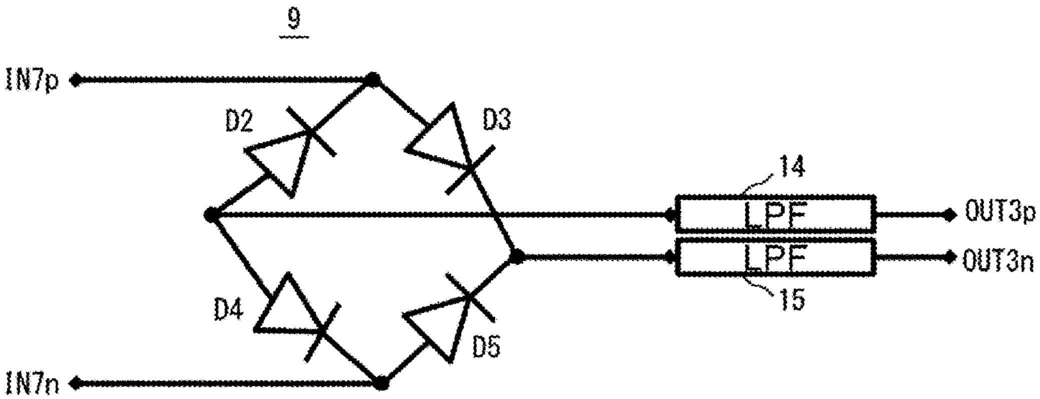
FIG. 12 is a circuit diagram showing another configuration of the amplitude detecting unit according to the sixth embodiment of the present invention.

Further, as shown in FIG. 12, the amplitude detecting unit 9 is made up of a diode D2 in which a signal IN7*p* on the positive phase side of the differential signal output from the adding unit 7 is input to a cathode, a diode D3 in which the signal IN7*p* is input to an anode, a diode D4 in which a signal IN7*n* on the negative phase side of the differential signal output from the adding unit 7 is input to a cathode and an anode is connected to an anode of a diode D2, a diode D5 in which the signal IN7*n* is input to an anode and a cathode is connected to a cathode of a diode D3, an LPF14 which flattens the signal at the connecting point between the anode of the diode D2 and the anode of the diode D4, and an LPF 15 which flattens a signal at a connecting point between the cathode of the diode D3 and the cathode of the diode D5. The diodes D2 to D5 constitute an asynchronous detecting circuit.

Seventh Embodiment

Further, by combining the Gilbert cell and the CML, a configuration in which the multiplying units 5 and 6 and the adding unit 7 are integrated may be realized. This configuration includes, as shown in FIG. 13, an NPN bipolar transistor Q27 in which a control signal IN1*n* (first control signal) is input to a base, and an output signal OUT2*p* of a positive phase side is output from a collector; an NPN bipolar transistor Q28 in which a control signal IN1*p* (second control signal) is input to a base, and an output signal OUT2*n* of the negative phase side is output from a collector; an NPN bipolar transistor Q29 in which a control signal IN1*n* is input to a base and the output signal OUT2*n* of the negative phase side is output from a collector; an NPN bipolar transistor Q30 in which a control signal IN1*p* is input to a base and an output signal OUT2*p* of the positive phase side is output from a collector; an NPN bipolar transistor Q31 in which a signal IN2*p* of the positive phase side of the differential signal output from the buffer unit 2 is input to a base, and a collector is connected to emitters of the transistors Q27 and Q28; an NPN bipolar transistor Q32 in which a signal IN2*n* of the negative phase side of the differential signal output from the buffer unit 2 is input to a base, and a collector is connected to emitters of the transistors Q29 and Q30; an NPN bipolar transistor Q33 in which a bias voltage VB is applied to a base; an NPN bipolar transistor Q34 in which a control signal IN3*n* (third control signal) is input to a base and an output signal OUT2*p* of the positive phase side is output from a collector; an NPN bipolar transistor Q35 in which a control signal IN3*p* (fourth control signal) is input to a base, and an output signal OUT2*n* of the negative phase side is output from a collector; an NPN bipolar transistor Q36 in which a control signal IN3*n* is input to a base and an output signal OUT2*n* of the negative phase side is output from a collector; an NPN bipolar transistor Q37 in which a control signal IN3*p* is input to a base, and an output signal OUT2*p* of the positive phase side is output from a collector; an NPN bipolar transistor Q38 in which a signal IN4*p* of the positive phase side of the differential signal output from the delay unit 4 is input to a base, and a collector is connected to emitters of the transistors Q34 and Q35; an NPN bipolar transistor Q39 in which a signal IN4*n* of the negative phase side of the differential signal output from the delay unit 4 is input to a base, and a collector is connected to emitters of the transistors Q36 and Q37; an NPN bipolar transistor Q40 in which a bias voltage VB is applied to a base; a resistor R28 which has one end connected to a power supply voltage VCC, and the other end connected to collectors of the transistors Q27, Q30, Q34 and Q37; a resistor R29 which has one end connected to the power supply voltage VCC and the other end connected to collectors of the transistors Q28, Q29, Q35 and Q36; a resistor R30 which has one end connected to an emitter of the transistor Q31 and the other end connected to a collector of the transistor Q33; a resistor R31 which has one end connected to an emitter of the transistor Q32, and the other end connected to the collector of the transistor Q33; a resistor R32 which has one end connected to an emitter of the transistor Q33, and the other end connected to the ground; a resistor R33 which has one end connected to an emitter of the transistor Q38, and the other end connected to the collector of the transistor Q40; a resistor R34 which has one end connected to an emitter of the transistor Q39, and the other end connected to the collector of the transistor Q40; and a resistor R35 which has one end connected to an emitter of the transistor Q40, and the other end connected to the ground.

The amplification factor (the amplitude A) of the multiplying unit 5 can be controlled by the voltage difference between the control signals IN1*p* and IN1*n*, and the amplification factor (the amplitude B) of the multiplying unit 6 can be controlled by the voltage difference between the control signals IN3*p* and IN3*n*. Further, as described in FIG. 7, the differential signals output from the buffer unit 2 may be allocated to IN1*p* and IN1*n*, the differential signals output from the delay unit 4 may be allocated to IN3*p* and IN3, and IN2*p*, IN2*n*, IN4*p* and IN4*n* may be used as control signals.

Figure 13:
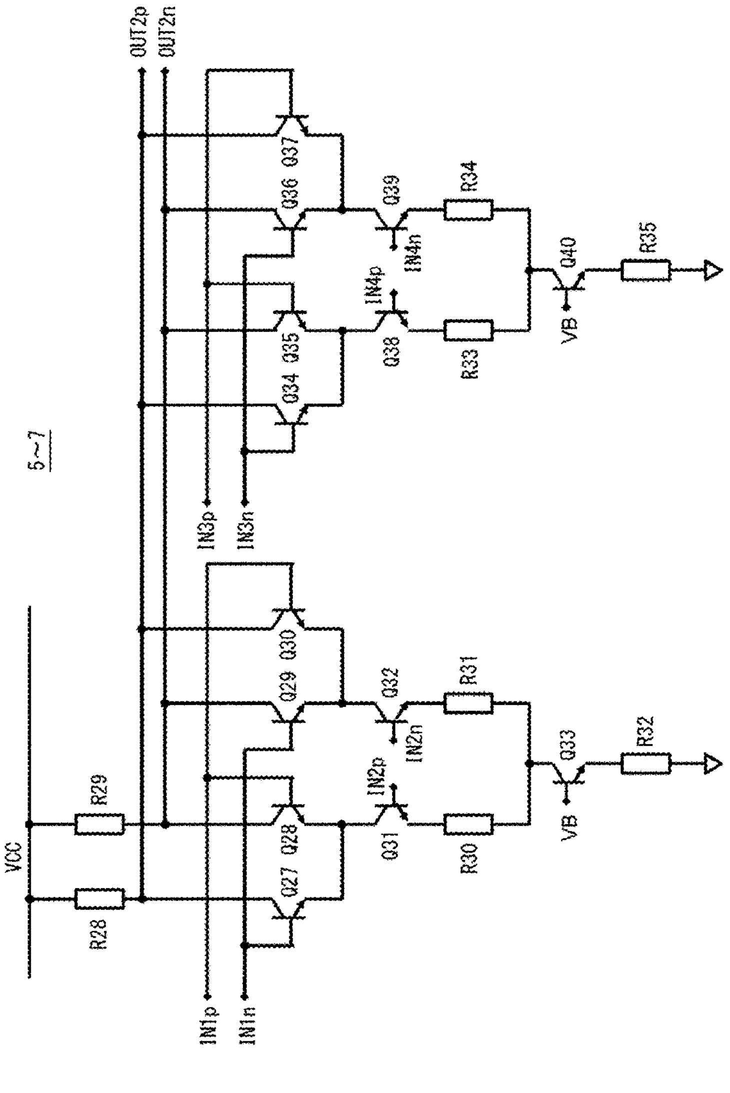
FIG. 13 is a circuit diagram showing configurations of a multiplying unit and an adding unit according to a seventh embodiment of the present invention.
Figure 14:
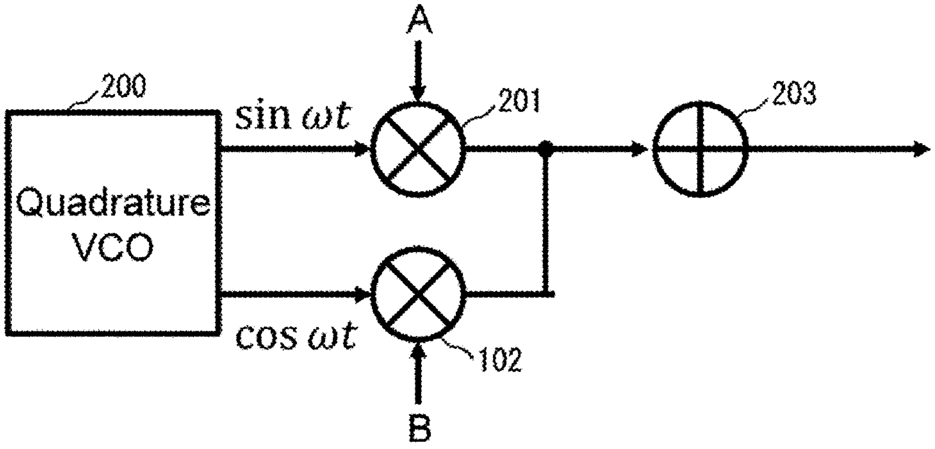
FIG. 14 is a block diagram showing a configuration of a phase adjustment circuit of the related art.

With the configuration shown in FIG. 13, an output {(IN1*p*−IN1*n*)×(IN2*p*−IN2*n*)}+{(IN3*p*−IN3*n*)×(IN4*p*−IN4*n*)} obtained by adding the result of multiplying (IN1*p*−IN1*n*) and (IN2*p*−IN2*n*) and the result of multiplying (IN3*p*−IN3*n*) and (IN4*p*−IN4*n*) becomes (OUT2*p*−OUT2*n*).

Although an embodiment in which a bipolar transistor is used as the transistors Q1 to Q40 is shown in FIGS. 7 to 9 and 13, a MOS transistor may be used. When the MOS transistor is used, in the above description, the base may be replaced with the gate, the collector may be replaced with the drain, and the emitter may be replaced with the source.

Further, a resistor or a capacitor for gain adjustment and frequency response adjustment may be inserted into the emitter or the source of the transistor, or both of the resistor and the capacitor may be inserted into the emitter or the source of the transistor. In addition, an arbitrary amplification circuit such as an emitter follower may be provided as necessary for level adjustment, driving force adjustment, and the like.

Some or all of the embodiments are also described in the following appendices, but are not limited to the following.

(Appendix 1) A phase adjustment circuit according to embodiments of the present invention include a sine wave output unit configured to output two sine wave signals of a fixed phase difference; a first multiplying unit configured to output a signal obtained by multiplying an amplitude of a first sine wave signal output from the sine wave output unit by a first variable; a second multiplying unit configured to output a signal obtained by multiplying an amplitude of a second sine wave signal output from the sine wave output unit by a second variable; an adding unit configured to add the signal output from the first multiplying unit and the signal output from the second multiplying unit; an amplitude detecting unit configured to detect an amplitude of an output signal of the adding unit; a differential amplifying unit configured to subtract and amplify the amplitude detected by the amplitude detecting unit from a target amplitude; a first low-pass filter configured to flatten an output result of the differential amplifying unit; a third multiplying unit configured to apply a signal obtained by multiplying an amplitude of the signal output from the first low-pass filter by a first constant, to the first multiplying unit as a control signal for determining the first variable; and a fourth multiplying unit configured to apply a signal obtained by multiplying the amplitude of the signal output from the first low-pass filter by a second constant, to the second multiplying unit as a control signal for determining the second variable.

(Appendix 2) In the phase adjustment circuit set forth in Appendix 1, the first multiplying unit includes a first transistor in which a first control signal or a signal on a negative phase side of the first sine wave signal of a differential form is input to a base or a gate, and a signal on a positive phase side is output from a collector or a drain;

a second transistor in which a second control signal or a signal on a positive phase side of the first sine wave signal is input to a base or a gate, and a signal on the negative phase side is output from a collector or a drain; a third transistor in which the first control signal or the signal on the negative phase side of the first sine wave signal is input to a base or a gate, and the signal on the negative phase side is output from a collector or a drain; a fourth transistor in which the second control signal or the signal on the positive phase side of the first sine wave signal is input to a base or a gate, and the signal on the positive phase side is output from a collector or a drain; a fifth transistor in which the signal on the positive phase side of the first sine wave signal or the second control signal is input to a base or a gate, and a collector or a drain is connected to emitters or sources of the first and second transistors; a sixth transistor in which the signal on the negative phase side of the first sine wave signal or the first control signal is input to a base or a gate, and a collector or a drain is connected to emitters or sources of the third and fourth transistors; a seventh transistor in which a bias voltage is applied to a base or a gate; a first resistor in which one end is connected to a power supply voltage and the other end is connected to collectors or drains of the first and fourth transistors; a second resistor in which one end is connected to the power supply voltage and the other end is connected to collectors or drains of the second and third transistors; a third resistor in which one end is connected to an emitter or a source of the fifth transistor and the other end is connected to a collector or a drain of the seventh transistor; a fourth resistor in which one end is connected to an emitter or a source of the sixth transistor and the other end is connected to the collector or drain of the seventh transistor; and a fifth resistor in which one end is connected to the emitter or source of the seventh transistor and the other end is connected to ground, in which the second multiplying unit includes an eighth transistor in which a third control signal or a signal on the negative phase side of the second sine wave signal of the differential type is input to a base or a gate, and a signal on the positive phase side is output from a collector or a drain; a ninth transistor in which a fourth control signal or a signal on the positive phase side of the second sine wave signal is input to a base or a gate, and a signal on the negative phase side is output from a collector or a drain; a tenth transistor in which the third control signal or the signal on the negative phase side of the second sine wave signal is input to a base or a gate, and the signal on the negative phase side is output from a collector or a drain; an eleventh transistor in which the fourth control signal or the signal on the positive phase side of the second sine wave signal is input to a base or a gate, and the signal on the positive phase side is output from a collector or a drain; a twelfth transistor in which the signal on the positive phase side of the second sine wave signal or the fourth control signal is input to a base or a gate, and a collector or drain is connected to emitters or sources of the eighth and ninth transistors; a thirteenth transistor in which the signal on the negative phase side of the second sine wave signal or the third control signal is input to a base or a gate, and a collector or a drain is connected to emitters or sources of the tenth or eleventh transistor; a fourteenth transistor in which a bias voltage is applied to a base or a gate; a sixth resistor in which one end is connected to the power supply voltage and the other end is connected to the collector or drain of the eighth and eleventh transistors; a seventh resistor in which one end is connected to the power supply voltage and the other end is connected to the collector or drain of the ninth and tenth transistor; an eighth resistor in which one end is connected to the emitter or source of the twelfth transistor and the other end is connected to the collector or drain of the fourteenth transistor; a ninth resistor in which one end is connected to the emitter or source of the thirteenth transistor and the other end is connected to the collector or drain of the fourteenth transistor; and a tenth resistor in which one end is connected to the emitter or source of the fourteenth transistor and the other end is connected to ground.

(Appendix 3) In the phase adjustment circuit set forth in Appendix 1, the adding unit includes a first transistor in which a signal on the negative phase side of the differential signal output from the first multiplying unit is input to a base or a gate, and a signal on the positive phase side is output from a collector or a drain; a second transistor in which a signal on the positive phase side of the differential signal output from the first multiplying unit is input to a base or a gate, and a signal on the negative phase side is output from a collector or a drain; a third transistor in which the signal on the positive phase side of the differential signal output from the second multiplying unit is input to a base or a gate, and a signal on the negative phase side is output from a collector or a drain; a fourth transistor in which the signal on the negative phase side of the differential signal output from the second multiplying unit is input to a base or a gate to, and the signal on the positive phase side is output from a collector or a drain; fifth and sixth transistors in which a bias voltage is applied to bases or gates; a first resistor which has one end connected to a power supply voltage, and the other end connected to the collectors or drains of the first and fourth transistors; a second resistor which has one end connected to the power supply voltage, and the other end connected to the collectors or drains of the second and third transistors; a third resistor which has one end connected to the emitter or source of the first transistor, and the other end connected to the collector or drain of the fifth transistor; a fourth resistor which has one end connected to the emitter or source of the second transistor, and the other end connected to the collector or drain of the fifth transistor; a fifth resistor which has one end connected to the emitter or source of the third transistor, and the other end connected to the collector or drain of the sixth transistor; a sixth resistor which has one end connected to the emitter or source of the fourth transistor, and the other end connected to the collector or drain of the sixth transistor; a seventh resistor which has one end connected to the emitter or source of the fifth transistor, and the other end connected to ground; and an eighth resistor which has one end connected to the emitter or source of the sixth transistor, and the other end connected to ground.

(Appendix 4) In the phase adjustment circuit set forth in Appendix 1, the amplitude detecting unit includes a squarer configured to square the output amplitude of the adding unit, and a second low-pass filter configured to flatten the amplitude squared by the squarer.

(Appendix 5) In the phase adjustment circuit set forth in Appendix 4, the second squarer includes a first transistor in which the signal on the negative phase side of the differential signal output from the adding unit is input to a base; a second transistor in which the signal on the positive phase side of the differential signal output from the adding unit is input to a base; a third transistor whose base and collector are connected; a fourth transistor whose base and collector are connected; a fifth transistor in which the bias voltage is applied to a base and a collector is connected to the emitter of the third transistor; a sixth transistor in which the bias voltage is applied to a base and a collector is connected to the emitter of the fourth transistor; a seventh transistor in which the signal on the negative phase side of the differential signal output from the adding unit is input to a base; an eighth transistor in which the signal on the positive phase side of the differential signal output from the adding unit is input to a base; a ninth transistor in which the signal on the negative phase side of the differential signal output from the adding unit is input to a base; a tenth transistor in which the signal on the positive phase side of the differential signal output from the adding unit is input to a base; an eleventh transistor in which a base is connected to the base and collector of the third transistor, and a collector is connected to the emitters of the seventh and eighth transistors; a twelfth transistor in which a base is connected to the base and collector of the fourth transistor, and a collector is connected to the emitters of the ninth and tenth transistors; a thirteenth transistor in which the bias voltage is applied to a base; a first resistor which has one end connected to the power supply voltage, and the other end connected to the collector of the first transistor; a second resistor which has one end connected to the power supply voltage, and the other end connected to the collector of the second transistor; a third resistor which has one end connected to the emitter of the first transistor, and the other end connected to the base and collector of the third transistor; a fourth resistor which has one end connected to the emitter of the second transistor, and the other end connected to the base and collector of the fourth transistor; a fifth resistor which has one end connected to the emitter of the fifth transistor, and the other end connected to ground; a sixth resistor which has one end connected to the emitter of the sixth transistor and the other end connected to ground; a seventh resistor which has one end connected to the power supply voltage, and the other end connected to the collectors of the seventh and tenth transistors; an eighth resistor which has one end connected to the power supply voltage, and the other end connected to the collectors of the eighth and ninth transistors; a ninth resistor which has one end connected to the emitter of the eleventh transistor, and the other end connected to the collector of the thirteenth transistor; a tenth resistor which has one end connected to the emitter of the twelfth transistor, and the other end connected to the collector of the thirteenth transistor, and an eleventh resistor which has one end connected to the emitter of the thirteenth transistor, and the other end connected to ground, and the second low-pass filter includes a twelfth resistor which has one end connected to the collectors of the seventh and tenth transistors, and outputs a output signal on the positive phase side from the other end; a thirteenth resistor which has one end connected to the collectors of the eighth and ninth transistors, and outputs the output signal on the negative phase side from the other end; a first capacitor which has one end connected to the collectors of the seventh and tenth transistors, and the other end connected to ground; a second capacitor which has one end connected to the collectors of the eighth and ninth transistors, and the other end connected to ground; a third capacitor which has one end connected to the other end of the twelfth resistor, and the other end connected to ground; and a fourth capacitor which has one end connected to the other end of the thirteenth resistor, and the other end connected to ground.

(Appendix 6) In the phase adjustment circuit set forth in Appendix 1, the amplitude detecting unit includes a first diode in which the signal on the positive phase side of the differential signal output from the adding unit is input to a cathode; a second diode in which the signal on the positive phase side of the differential signal output from the adding unit is input to an anode; a third diode in which the signal on the negative phase side of the differential signal output from the adding unit is input to a cathode, and an anode is connected to an anode of the first diode; a fourth diode in which the signal on the negative phase side of the differential signal output from the adding unit is input to an anode, and a cathode is connected to a cathode of the second diode; a second low-pass filter configured to flatten a signal at a connecting point between the anode of the first diode and the anode of the third diode; and a third low-pass filter configured to flatten a signal at a connecting point between the cathode of the second diode and the cathode of the fourth diode.

(Appendix 7) In the phase adjustment circuit set forth in Appendix 1, the differential amplifying includes a first transistor in which the signal on the positive phase side of the differential signal output from the amplitude detecting unit is input to a base or a gate, and the signal on the positive phase side is output from a collector or a drain; a second transistor in which the signal on the negative phase side of the differential signal output from the amplitude detecting unit is input to a base or a gate, and a signal on the negative phase side is output from a collector or a drain; a third transistor in which the signal on the positive phase side of the differential signal indicating the target amplitude is input to a base or a gate, and the signal on the negative phase side is output from a collector or a drain; a fourth transistor in which the signal on the negative phase side of the differential signal indicating the target amplitude is input to a base or a gate, and the signal on the positive phase side is output from a collector or a drain; fifth and sixth transistors in which the bias voltage is applied to bases or gates; a first resistor in which one end is connected to the power supply voltage, and the other end is connected to the collectors or drains of the first and fourth transistors; a second resistor in which one end is connected to the power supply voltage, and the other end is connected to the collectors or drains of the second and third transistors; a third resistor in which one end is connected to the emitter or source of the first transistor, and the other end is connected to the collector or drain of the fifth transistor; a fourth resistor in which one end is connected to the emitter or source of the second transistor, and the other end is connected to the collector or drain of the fifth transistor; a fifth resistor in which one end is connected to the emitter or source of the third transistor, and the other end is connected to the collector or drain of the sixth transistor; a sixth resistor in which one end is connected to the emitter or source of the fourth transistor, and the other end is connected to the collector or drain of the sixth transistor; a seventh resistor in which one end is connected to the emitter or source of the fifth transistor, and the other end is connected to ground; and an eighth resistor in which one end is connected to the emitter or source of the sixth transistor, and the other end is connected to ground.

(Appendix 8) In the phase adjustment circuit set forth in Appendix 1, the first and second multiplying units and the adding unit include a first transistor in which a first control signal or a signal on the negative phase side of the first sine wave signal of the differential form is input to a base or a gate, and a signal on the positive phase side is output from a collector or a drain; a second transistor in which a second control signal or a signal on the positive phase side of the first sine wave signal is input to a base or a gate, and a signal on the negative phase side is output from a collector or a drain; a third transistor in which the first control signal or the signal on the negative phase side of the first sine wave signal is input to a base or a gate, and the signal on the negative phase side is output from a collector or a drain; a fourth transistor in which the second control signal or the signal on the positive phase side of the first sine wave signal is input to a base or a gate, and the signal on the positive phase side is output from a collector or a drain; a fifth transistor in which the signal on the positive phase side of the first sine wave signal or the second control signal is input to a base or a gate, and a collector or a drain is connected to the emitters or sources of the first and second transistors; a sixth transistor in which the signal on the negative phase side of the first sine wave signal or the first control signal is input to a base or a gate, and a collector or a drain is connected to the emitters or sources of the third and fourth transistors; a seventh transistor in which the bias voltage is applied to a base or a gate; an eighth transistor in which a third control signal or the signal on the negative phase side of the second sine wave signal of the differential type is input to a base or gate, and the signal on the positive phase side is output from a collector or a drain; a ninth transistor in which a fourth control signal or the signal on the positive phase side of the second sine wave signal is input to a base or gate, and the signal on the negative phase side is output from a collector or a drain; a tenth transistor in which the third control signal or the signal on the negative phase side of the second sine wave signal is input to a base or gate, and the signal on the negative phase side is output from a collector or a drain; an eleventh transistor in which the fourth control signal or the signal on the positive phase side of the second sine wave signal is input to a base or a gate, and the signal on the positive phase side is output from a collector or a drain; a twelfth transistor in which the signal on the positive phase side of the second sine wave signal or the fourth control signal is input a base or a gate, and a collector or a drain is connected to the emitters or sources of the eighth and ninth transistors; a thirteenth transistor in which the signal on the negative phase side of the second sine wave signal or the third control signal is input to a base or a gate, and a collector or a drain is connected to the emitters or sources of the tenth or eleventh transistor; a fourteenth transistor in which the bias voltage is applied to a base or a gate; a first resistor in which one end is connected to the power supply voltage, and the other end is connected to the collectors or drains of the first, fourth, eighth, and eleventh transistors; a second resistor in which one end is connected to the power supply voltage, and the other end is connected to the collectors or drains of the second, third, ninth, and tenth transistor; a third resistor in which one end is connected to the emitter or source of the fifth transistor, and the other end is connected to the collector or drain of the seventh transistor; a fourth resistor in which one end is connected to the emitter or source of the sixth transistor, and the other end is connected to the collector or drain of the seventh transistor; a fifth resistor in which one end is connected to the emitter or source of the seventh transistor, and the other end is connected to ground; a sixth resistor in which one end is connected to the emitter or source of the twelfth transistor, and the other end is connected to the collector or drain of the fourteenth transistor; a seventh resistor in which one end is connected to the emitter or source of the thirteenth transistor, and the other end is connected to the collector or drain of the fourteenth transistor; and an eighth resistor in which one end is connected to the emitter or source of the fourteenth transistor, and the other end is connected to ground.

INDUSTRIAL APPLICABILITY

The embodiments of present invention can be applied to the technique of adjusting the phase of a sine wave.

REFERENCE SIGNS LIST

1 Clock generation unit
2,3 Buffer unit
4 Delay unit
5, 6, 12, 13 Multiplying unit
7 Adding unit
9 Amplitude detecting unit
10 Differential amplifying unit
11, 14, 15 Low pass filter
16 Sine wave output unit
Q1 to Q40 Transistor
D1 to D5 Diode
R1 to R35 Resistor
C1 to C6 Capacitor

The invention claimed is:

1. A phase adjustment circuit comprising:
a sine wave output circuit configured to output two sine wave signals having a fixed phase difference;
a first multiplier configured to multiply an amplitude of a first sine wave signal output from the sine wave output circuit by a first variable;
a second multiplier configured to multiply an amplitude of a second sine wave signal output from the sine wave output circuit by a second variable;
an adder configured to add signals from the first multiplier and the second multiplier;
a feedback circuit configured to obtain, based on an amplitude of a signal from the adder, a first control signal for determining the first variable and a second control signal for determining the second variable, and apply the first control signal and the second control signal to the first multiplier and the second multiplier, respectively;

wherein the feedback circuit includes an amplitude detector configured to detect an amplitude of a signal from the adder;

a differential amplifier configured to subtract and amplify the amplitude detected by the amplitude detector from a target amplitude;

a first low-pass filter configured to filter an output from the differential amplifier;

a third multiplier configured to multiply an amplitude of a signal from the first low-pass filter by a first constant, and apply the result to the first multiplier as the first control signal for determining the first variable; and a fourth multiplier configured to multiply the amplitude of the signal from the first low-pass filter by a second constant, and apply the result to the second multiplier as the second control signal for determining the second variable.

2. The phase adjustment circuit according to claim 1, wherein the first multiplier includes a first transistor having a base or gate configured to receive a first control signal or a signal on a negative phase side of the first sine wave signal of a differential form, and a collector or drain configured to output a signal on a positive phase side, a second transistor having a base or gate configured to receive a second control signal or a signal on a positive phase side of the first sine wave signal, and a collector or drain configured to output a signal on the negative phase side, a third transistor having a base or gate configured to receive the first control signal or the signal on the negative phase side of the first sine wave signal, and a collector or drain configured to output the signal on the negative phase side, a fourth transistor having a base or gate configured to receive the second control signal or the signal on the positive phase side of the first sine wave signal, and a collector or drain configured to output the signal on the positive phase side, a fifth transistor having a base or gate configured to receive the signal on the positive phase side of the first sine wave signal or the second control signal, and a collector or drain connected to emitters or sources of the first and second transistors, a sixth transistor having a base or gate configured to receive the signal on the negative phase side of the first sine wave signal or the first control signal, and a collector or drain connected to emitters or sources of the third and fourth transistors, a seventh transistor having a base or gate configured to receive a bias voltage, a first resistor having one end connected to a power supply voltage and another end connected to collectors or drains of the first and fourth transistors, a second resistor having one end connected to the power supply voltage and another end connected to collectors or drains of the second and third transistors, a third resistor having one end connected to an emitter or source of the fifth transistor and another end connected to a collector or drain of the seventh transistor;

a fourth resistor having one end connected to an emitter or a source of the sixth transistor and another end connected to the collector or drain of the seventh transistor, and a fifth resistor having one end connected to an emitter or a source of the seventh transistor and another end connected to ground, wherein the second multiplier includes an eighth transistor having a base or gate configured to receive a third control signal or a signal on the negative phase side of the second sine wave signal of a differential type, and a collector or drain configured to output a signal on the positive phase side, a ninth transistor having a base or gate configured to receive a fourth control signal or a signal on the positive phase side of the second sine wave signal, and a collector or drain configured to output a signal on the negative phase side, a tenth transistor having a base or gate configured to receive the third control signal or the signal on the negative phase side of the second sine wave signal, and a collector or drain configured to output the signal on the negative phase side, an eleventh transistor having a base or gate configured to receive the fourth control signal or the signal on the positive phase side of the second sine wave signal, and a collector or drain configured to output the signal on the positive phase side, a twelfth transistor having a base or gate configured to receive the signal on the positive phase side of the second sine wave signal or the fourth control signal, and a collector or drain connected to emitters or sources of the eighth and ninth transistors, a thirteenth transistor having a base or gate configured to receive the signal on the negative phase side of the second sine wave signal or the third control signal, and a collector or drain connected to emitters or sources of the tenth or eleventh transistor, a fourteenth transistor having a base or gate configured to receive a bias voltage, a sixth resistor having one end connected to the power supply voltage and another end connected to the collector or drain of the eighth and eleventh transistors, a seventh resistor having one end connected to the power supply voltage and another end connected to the collector or drain of the ninth and tenth transistor, an eighth resistor having one end connected to an emitter or a source of the twelfth transistor and another end connected to the collector or drain of the fourteenth transistor, a ninth resistor having one end connected to an emitter or a source of the thirteenth transistor and another end connected to the collector or drain of the fourteenth transistor, and a tenth resistor having one end connected to an emitter or a source of the fourteenth transistor and another end connected to ground.

3. The phase adjustment circuit according to claim 1, wherein the adder includes a first transistor having a base or gate configured to receive a signal on the negative phase side of the differential signal from the first multiplier, and a collector or drain configured to output a signal on the positive phase side, a second transistor having a base or gate configured to receive a signal on the positive phase side of the differential signal from the first multiplier, and a collector or drain configured to output a signal on the negative phase side, a third transistor having a base or gate configured to receive the signal on the positive phase side of the differential signal from the second multiplier, and a collector or drain configured to output a signal on the negative phase side, a fourth transistor having a base or gate configured to receive the signal on the negative phase side of the differential signal from the second multiplier, and a collector or drain configured to output the signal on the positive phase side, fifth and sixth transistors having bases or gates configured to receive a bias voltage, a first resistor having one end connected to a power supply voltage, and another end connected to the collectors or drains of the first and fourth transistors, a second resistor having one end connected to the power supply voltage, and another end connected to the collectors or drains of the second and third transistors, a third resistor having one end connected to an emitter or a source of the first transistor, and another end connected to the collector or drain of the fifth transistor, a fourth resistor having one end connected to an emitter or a source of the second transistor, and another end connected to the collector or drain of the fifth transistor, a fifth resistor having one end connected to an emitter or a source of the third transistor, and another end connected to the collector or drain of the sixth transistor, a sixth resistor having one end connected to an emitter or a source of the fourth transistor, and another end connected to the collector or drain of the sixth transistor, a seventh resistor having one end connected to the emitter or source of the fifth transistor, and another end connected to ground, and an eighth resistor having one end connected to the emitter or source of the sixth transistor, and another end connected to ground.

4. The phase adjustment circuit according to claim 1, wherein the amplitude detector includes a squarer configured to square an output amplitude of the adder, and a second low-pass filter configured to filter the amplitude squared by the squarer.

5. The phase adjustment circuit according to claim 4, wherein the squarer includes a first transistor having a base configured to receive the signal on the negative phase side of the differential signal from the adder, a second transistor having a base configured to receive the signal on the positive phase side of the differential signal from the adder, a third transistor having a base and collector connected, a fourth transistor having a base and collector connected, a fifth transistor having a base configured to receive the bias voltage and a collector connected to the emitter of the third transistor;

a sixth transistor having a base configured to receive the bias voltage and a collector connected to the emitter of the fourth transistor, a seventh transistor having a base configured to receive the signal on the negative phase side of the differential signal from the adder, an eighth transistor having a base configured to receive the signal on the positive phase side of the differential signal from the adder, a ninth transistor having a base configured to receive the signal on the negative phase side of the differential signal from the adder, a tenth transistor having a base configured to receive the signal on the positive phase side of the differential signal from the adder, an eleventh transistor having a base connected to the base and collector of the third transistor, and a collector connected to the emitters of the seventh and eighth transistors, a twelfth transistor having a base connected to the base and collector of the fourth transistor, and a collector connected to the emitters of the ninth and tenth transistors, a thirteenth transistor having a base configured to receive the bias voltage, a first resistor having one end connected to the power supply voltage, and another end connected to the collector of the first transistor, a second resistor having one end connected to the power supply voltage, and another end connected to the collector of the second transistor, a third resistor having one end connected to the emitter of the first transistor, and another end connected to the base and collector of the third transistor, a fourth resistor having one end connected to the emitter of the second transistor, and another end connected to the base and collector of the fourth transistor, a fifth resistor having one end connected to the emitter of the fifth transistor, and another end connected to ground, a sixth resistor having one end connected to the emitter of the sixth transistor and another end connected to ground, a seventh resistor having one end connected to the power supply voltage, and another end connected to the collectors of the seventh and tenth transistors, an eighth resistor having one end connected to the power supply voltage, and another end connected to the collectors of the eighth and ninth transistors, a ninth resistor having one end connected to an emitter of the eleventh transistor, and another end connected to the collector of the thirteenth transistor, a tenth resistor having one end connected to the emitter of the twelfth transistor, and another end connected to the collector of the thirteenth transistor, and an eleventh resistor having one end connected to the emitter of the thirteenth transistor, and another end connected to ground, wherein the second low-pass filter includes a twelfth resistor having one end connected to the collectors of the seventh and tenth transistors, and configured to output an output signal on the positive phase side from another end, a thirteenth resistor having one end connected to the collectors of the eighth and ninth transistors, and configured to output the output signal on the negative phase side from another end, a first capacitor having one end connected to the collectors of the seventh and tenth transistors, and another end connected to ground, a second capacitor having one end connected to the collectors of the eighth and ninth transistors, and another end connected to ground, a third capacitor having one end connected to the other end of the twelfth resistor, and another end connected to ground, and a fourth capacitor having one end connected to the other end of the thirteenth resistor, and another end connected to ground.

6. The phase adjustment circuit according to claim 1, wherein the amplitude detector includes a first diode having a cathode configured to receive the signal on the positive phase side of the differential signal from the adder, a second diode having an anode configured to receive the signal on the positive phase side of the differential signal from the adder, a third diode having a cathode configured to receive the signal on the negative phase side of the differential signal from the adder, and an anode connected to an anode of the first diode, a fourth diode having an anode configured to receive the signal on the negative phase side of the differential signal from the adder, and a cathode connected to a cathode of the second diode, a second low-pass filter configured to filter a signal at a connecting point between the anode of the first diode and the anode of the third diode, and a third low-pass filter configured to filter a signal at a connecting point between the cathode of the second diode and the cathode of the fourth diode.

7. The phase adjustment circuit according to claim 1, wherein the differential amplifier includes a first transistor having a base or gate configured to receive the signal on the positive phase side of the differential signal from the amplitude detector, and a collector or drain configured to output the signal on the positive phase side, a second transistor having a base or gate configured to receive the signal on the negative phase side of the differential signal from the amplitude detector, and a collector or drain configured to output a signal on the negative phase side, a third transistor having a base or gate configured to receive the signal on the positive phase side of the differential signal indicating the target amplitude, and a collector or drain configured to output the signal on the negative phase side, a fourth transistor having a base or gate configured to receive the signal on the negative phase side of the differential signal indicating the target amplitude, and a collector or drain configured to output the signal on the positive phase side, fifth and sixth transistors having bases or gates configured to receive the bias voltage, a first resistor having one end connected to the power supply voltage, and another end connected to the collectors or drains of the first and fourth transistors, a second resistor having one end connected to the power supply voltage, and another end connected to the collectors or drains of the second and third transistors, a third resistor having one end connected to the emitter or source of the first transistor, and another end connected to the collector or drain of the fifth transistor, a fourth resistor having one end connected to the emitter or source of the second transistor, and another end connected to the collector or drain of the fifth transistor, a fifth resistor having one end connected to the emitter or source of the third transistor, and another end connected to the collector or drain of the sixth transistor, a sixth resistor having one end connected to the emitter or source of the fourth transistor, and another end connected to the collector or drain of the sixth transistor, a seventh resistor having one end connected to the emitter or source of the fifth transistor, and another end connected to ground, and an eighth resistor having one end connected to the emitter or source of the sixth transistor, and another end connected to ground.

8. The phase adjustment circuit according to claim 1, wherein the first and second multipliers and the adder include a first transistor having a base or gate configured to receive a first control signal or a signal on the negative phase side of the first sine wave signal of a differential form, and a collector or drain configured to output a signal on the positive phase side, a second transistor having a base or gate configured to receive a second control signal or a signal on the positive phase side of the first sine wave signal, and a collector or drain configured to output a signal on the negative phase side, a third transistor having a base or gate configured to receive the first control signal or the signal on the negative phase side of the first sine wave signal, and a collector or drain configured to output the signal on the negative phase side, a fourth transistor having a base or gate configured to receive the second control signal or the signal on the positive phase side of the first sine wave signal, and a collector or drain configured to output the signal on the positive phase side, a fifth transistor having a base or gate configured to receive the signal on the positive phase side of the first sine wave signal or the second control signal, and a collector or drain connected to the emitters or sources of the first and second transistors, a sixth transistor having a base or gate configured to receive the signal on the negative phase side of the first sine wave signal or the first control signal, and a collector or drain connected to the emitters or sources of the third and fourth transistors, a seventh transistor having a base or gate configured to receive the bias voltage, an eighth transistor having a base or gate configured to receive a third control signal or the signal on the negative phase side of the second sine wave signal of the differential type, and a collector or drain configured to output the signal on the positive phase side, a ninth transistor having a base or gate configured to receive a fourth control signal or the signal on the positive phase side of the second sine wave signal, and a collector or drain configured to output the signal on the negative phase side, a tenth transistor having a base or gate configured to receive the third control signal or the signal on the negative phase side of the second sine wave signal, and a collector or drain configured to output the signal on the negative phase side, an eleventh transistor having a base or gate configured to receive the fourth control signal or the signal on the positive phase side of the second sine wave signal, and a collector or drain configured to output the signal on the positive phase side, a twelfth transistor having a base or gate configured to receive the signal on the positive phase side of the second sine wave signal or the fourth control signal, and a collector or drain connected to the emitters or sources of the eighth and ninth transistors, a thirteenth transistor having a base or gate configured to receive the signal on the negative phase side of the second sine wave signal or the third control signal, and a collector or drain connected to the emitters or sources of the tenth or eleventh transistor, a fourteenth transistor having a base or gate configured to receive the bias voltage, a first resistor having one end connected to the power supply voltage, and another end connected to the collectors or drains of the first, fourth, eighth, and eleventh transistors, a second resistor having one end connected to the power supply voltage, and another end connected to the collectors or drains of the second, third, ninth, and tenth transistors, a third resistor having one end connected to the emitter or source of the fifth transistor, and another end connected to the collector or drain of the seventh transistor, a fourth resistor having one end connected to the emitter or source of the sixth transistor, and another end connected to the collector or drain of the seventh transistor, a fifth resistor having one end connected to the emitter or source of the seventh transistor, and another end connected to ground, a sixth resistor having one end connected to the emitter or source of the twelfth transistor, and another end connected to the collector or drain of the fourteenth transistor, a seventh resistor having one end connected to the emitter or source of the thirteenth transistor, and another end connected to the collector or drain of the fourteenth transistor, and an eighth resistor having one end connected to the emitter or source of the fourteenth transistor, and another end connected to ground.

9. The phase adjustment circuit according to claim 1, wherein the sine wave output circuit includes:

a clock generation unit configured to generate a sinusoidal clock signal;

a first buffer unit configured to receive the sinusoidal clock signal; and a second buffer unit and a delay unit configured to receive the sinusoidal clock signal and introduce a phase delay.

10. The phase adjustment circuit according to claim 1, wherein the first multiplier and the second multiplier each comprise a Gilbert cell.

11. The phase adjustment circuit according to claim 1, wherein the adder comprises a current mode logic block configured for current addition.

12. The phase adjustment circuit according to claim 1, wherein the amplitude detector includes a squarer configured to square the amplitude of the signal output from the adder.

13. The phase adjustment circuit according to claim 1, wherein the amplitude detector comprises a peak detector.

* * * * *